(12) United States Patent
Sohn et al.

(10) Patent No.: US 9,536,586 B2
(45) Date of Patent: Jan. 3, 2017

(54) MEMORY DEVICE AND MEMORY SYSTEM HAVING THE SAME

(71) Applicant: Samsung Electronics Co., Ltd., Suwon-si (KR)

(72) Inventors: Young-Soo Sohn, Seoul (KR); Chul-Woo Park, Yongin-si (KR); Si-Hong Kim, Yongin-si (KR); Kwang-Il Park, Yongin-si (KR); Jae-Youn Youn, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/514,416

(22) Filed: Oct. 15, 2014

(65) Prior Publication Data
US 2015/0243338 A1    Aug. 27, 2015

(30) Foreign Application Priority Data
Feb. 21, 2014   (KR) .................. 10-2014-0020751

(51) Int. Cl.
| G11C 7/10 | (2006.01) |
| G11C 11/406 | (2006.01) |
| G11C 11/408 | (2006.01) |
| G11C 11/4076 | (2006.01) |

(52) U.S. Cl.
CPC .......... *G11C 11/406* (2013.01); *G11C 11/4087* (2013.01); *G11C 11/4076* (2013.01)

(58) Field of Classification Search
CPC . G11C 11/406; G11C 11/4087; G11C 11/4076

USPC ................ 365/189.05, 222, 189.011, 189.15
See application file for complete search history.

(56) References Cited

U.S. PATENT DOCUMENTS

| 5,777,921 | A | 7/1998 | Takata et al. |
| 6,108,265 | A | 8/2000 | Takeuchi |
| 7,139,216 | B2 | 11/2006 | Higashi et al. |
| 7,352,642 | B2 | 4/2008 | Ohsawa |
| 7,379,323 | B2 | 5/2008 | Miyamoto et al. |
| 7,457,186 | B2 | 11/2008 | Ohsawa |
| 7,460,425 | B2 | 12/2008 | Miyamoto |
| 7,830,742 | B2 | 11/2010 | Han |
| 8,027,216 | B2 | 9/2011 | Fukuda et al. |
| 2015/0170733 | A1* | 6/2015 | Lee .................. G11C 11/40615 365/222 |

FOREIGN PATENT DOCUMENTS

JP            09-062561 A     3/1997

* cited by examiner

*Primary Examiner* — Fernando Hidalgo
(74) *Attorney, Agent, or Firm* — Muir Patent Law, PLLC

(57) ABSTRACT

A memory device includes a memory cell array, an intensively accessed row detection circuit, and a refresh control circuit. The memory cell array includes a plurality of memory cell rows. The intensively accessed row detection circuit generates an intensively accessed row address indicating an intensively accessed memory cell row among the plurality of memory cell rows based on an accumulated access time for each of the plurality of memory cell rows. The refresh control unit preferentially refreshes neighboring memory cell rows adjacent to the intensively accessed memory cell row indicated by the intensively accessed row address when receiving the intensively accessed row address from the intensively accessed row detection unit. The memory device effectively reduces a rate of data loss.

20 Claims, 13 Drawing Sheets

MEMORY DEVICE AND MEMORY SYSTEM HAVING THE SAME

CROSS-REFERENCE TO RELATED APPLICATION(S)

This application claims priority under 35 USC §119 to Korean Patent Application No. 10-2014-0020751, filed on Feb. 21, 2014 in the Korean Intellectual Property Office (KIPO), the contents of which are herein incorporated by reference in their entirety.

BACKGROUND

1. Technical Field

Example embodiments relate to a semiconductor device, and more particularly to a memory device and a memory system having the memory device.

2. Description of the Related Art

Generally, a volatile memory device such as a dynamic random access memory (DRAM) stores data by charging a capacitor. Since the charge stored in the capacitor may leak with a passage of time, the volatile memory device is typically required to perform a refresh operation periodically.

As a fabrication process of the memory device is scaled down, space between word-lines becomes narrower. Therefore, disturbance phenomenon occurs more frequently than before, during which charge of a memory cell connected to one word-line is influenced by voltage distribution of adjacent word-lines.

When one particular word-line is intensively accessed, the disturbance phenomenon increases in which the charge of the memory cell connected to neighboring word-lines adjacent to the particular word-line may be lost due to an activated voltage of the particular word-line.

SUMMARY

Some example embodiments are directed to provide a memory device that effectively reduces a rate of data loss.

Some example embodiments are directed to provide a memory system including the memory device.

According to example embodiments, a memory device includes a memory cell array, an intensively accessed row detection circuit, and a refresh control circuit. The memory cell array includes a plurality of memory cell rows. The intensively accessed row detection circuit generates an intensively accessed row address indicating an intensively accessed memory cell row among the plurality of memory cell rows based on an accumulated access time for each of the plurality of memory cell rows. The refresh control circuit preferentially refreshes neighboring memory cell rows adjacent to the intensively accessed memory cell row indicated by the intensively accessed row address when receiving the intensively accessed row address from the intensively accessed row detection circuit.

In example embodiments, the intensively accessed row detection circuit may receive an active signal and a row address indicating one of the plurality of memory cell rows, and may generate the intensively accessed row address based on an amount of time intervals for which the active signal is activated for each of the plurality of memory cell rows.

In example embodiments, the intensively accessed row detection circuit may include a latch circuit configured to latch a row address when an active signal is activated and to output the latched row address, a pulse generation circuit configured to generate a count pulse signal having a first period while the active signal is activated, and a row address profiler. The row address profiler is configured to store access values corresponding to the plurality of memory cell rows, to sequentially increase one of the access values which corresponds to the latched row address in synchronization with the count pulse signal, and to generate the intensively accessed row address based on the access values.

The first period of the count pulse signal may correspond to a row cycle time of the memory device.

The pulse generation circuit may adjust the first period of the count pulse signal based on a period control signal.

The pulse generation circuit may include a delay circuit configured to be turned on while the active signal is activated, and to generate a delay signal by delaying an input signal for a delay time, which corresponds to a half of the first period, and an inverter configured to generate the count pulse signal by inverting the delay signal, and to provide the count pulse signal to the delay circuit as the input signal. The delay circuit may output the delay signal having a logic low level at an initial stage.

The delay circuit may adjust a length of the delay time based on a period control signal.

The pulse generation circuit may include a reference code generation circuit configured to generate a reference code that is proportional to a frequency of a clock signal, in response to a clock change signal. The pulse generation circuit may also include a first counting circuit configured to be turned on while the active signal is activated, to generate a time code by performing an up-count operation in synchronization with the clock signal, and to reset the time code in response to a rising edge of a reset signal. In addition, the pulse generation circuit may include a comparator configured to output the reset signal having a logic low level when the time code is less than the reference code, and to output the reset signal having a logic high level when the time code is equal to or greater than the reference code. Further, the pulse generation circuit may include a toggle flip flop configured to generate an output signal toggling in response to the rising edge of the reset signal, and to output the output signal as the count pulse signal.

The reference code generation circuit may include a delay circuit configured to generate a delay signal by delaying a clock change signal for a delay time, which corresponds to a half of the first period, an inverter configured to generate an inverted signal by inverting the delay signal, an AND gate configured to perform an AND operation on the clock change signal and the inverted signal to generate a start signal, and a second counting circuit configured to reset a count value and to perform an up-count operation on the count value in synchronization with the clock signal when the start signal is activated to the logic high level. The second counting circuit is configured to stop performing the up-count operation and to output the count value as the reference code when the start signal is deactivated to the logic low level.

The pulse generation circuit may bypass the active signal to output the active signal as the count pulse signal when the pulse generation circuit receives an on-off signal having a first logic level.

At every predetermined time interval, the row address profiler may output a row address, which corresponds to a greatest access value among the access values, as the intensively accessed row address, and the row address profiler may reset the access values.

The refresh control circuit may generate a refresh row address that sequentially increases, and refresh a memory cell row corresponding to the refresh row address. When the refresh control circuit receives the intensively accessed row address from the row address profiler at the every predetermined time interval, the refresh control circuit may preferentially refresh a memory cell row corresponding to an address, which is less than the intensively accessed row address by one, and a memory cell row corresponding to an address, which is greater than the intensively accessed row address by one. Then, the refresh control circuit may refresh the memory cell row corresponding to the refresh row address.

When each of the access values exceeds a threshold value, the row address profiler may output an address, which corresponds to an access value exceeding the threshold value among the access values, as the intensively accessed row address together with an interrupt signal. The row address profiler may reset the access values at every predetermined time interval.

The predetermined time interval may correspond to a refresh period of the memory cell array during which the plurality of memory cell rows included in the memory cell array are refreshed.

The refresh control circuit may generate the refresh row address that sequentially increases, and refresh the memory cell row corresponding to the refresh row address. When the refresh control circuit receives the interrupt signal and the intensively accessed row address from the row address profiler, the refresh control circuit may preferentially refresh the memory cell row corresponding to the address, which is less than the intensively accessed row address by one, and the memory cell row corresponding to the address, which is greater than the intensively accessed row address by one. Then, the refresh control circuit may refresh the memory cell row corresponding to the refresh row address.

According to example embodiments, a memory system includes a memory device and a memory controller. The memory controller performs a read operation and a write operation on the memory device. The memory device includes a memory cell array including a plurality of memory cell rows, an intensively accessed row detection circuit configured to generate an intensively accessed row address indicating an intensively accessed memory cell row among the plurality of memory cell rows based on an accumulation of access time for each of the plurality of memory cell rows, and a refresh control circuit configured to preferentially refresh neighboring memory cell rows adjacent to the intensively accessed memory cell row indicated by the intensively accessed row address when receiving the intensively accessed row address from the intensively accessed row detection circuit.

In example embodiments, the intensively accessed row detection circuit may receive an active signal and a row address indicating one of the plurality of memory cell rows from the memory controller, and generate the intensively accessed row address based on an amount of time intervals for which the active signal is activated for each of the plurality of memory cell rows.

In example embodiments, the intensively accessed row detection circuit may include a latch circuit configured to latch a row address provided from the memory controller when an active signal provided from the memory controller is activated, and to output the latched row address, a pulse generation circuit configured to generate a count pulse signal having a first period while the active signal is activated, and a row address profiler. The row address profiler is configured to store access values corresponding to the plurality of memory cell rows, to sequentially increase one of the access values which corresponds to the latched row address in synchronization with the count pulse signal, and to generate the intensively accessed row address based on the access values.

The pulse generation circuit may include a delay circuit configured to be turned on while the active signal is activated, and to generate a delay signal by delaying an input signal for a delay time, which corresponds to a half of the first period. The pulse generation circuit may also include an inverter configured to generate the count pulse signal by inverting the delay signal, and to provide the count pulse signal to the delay circuit as the input signal. The delay circuit may output the delay signal having a logic low level at an initial stage.

The pulse generation circuit may include a reference code generation circuit configured to generate a reference code that is proportional to a frequency of a clock signal in response to a clock change signal. The pulse generation circuit may also include a first counting circuit configured to be turned on while the active signal is activated, to generate a time code by performing an up-count operation in synchronization with the clock signal, and to reset the time code in response to a rising edge of a reset signal. In addition, the pulse generation circuit may include a comparator configured to output the reset signal having a logic low level when the time code is less than the reference code, and to output the reset signal having a logic high level when the time code is equal to or greater than the reference code. Further, the pulse generation circuit may include a toggle flip flop configured to generate an output signal toggling in response to the rising edge of the reset signal, and to output the output signal as the count pulse signal.

BRIEF DESCRIPTION OF THE DRAWINGS

Illustrative, non-limiting example embodiments will be more clearly understood from the following detailed description in conjunction with the accompanying drawings.

DETAILED DESCRIPTION OF THE EMBODIMENTS

Figure 1:
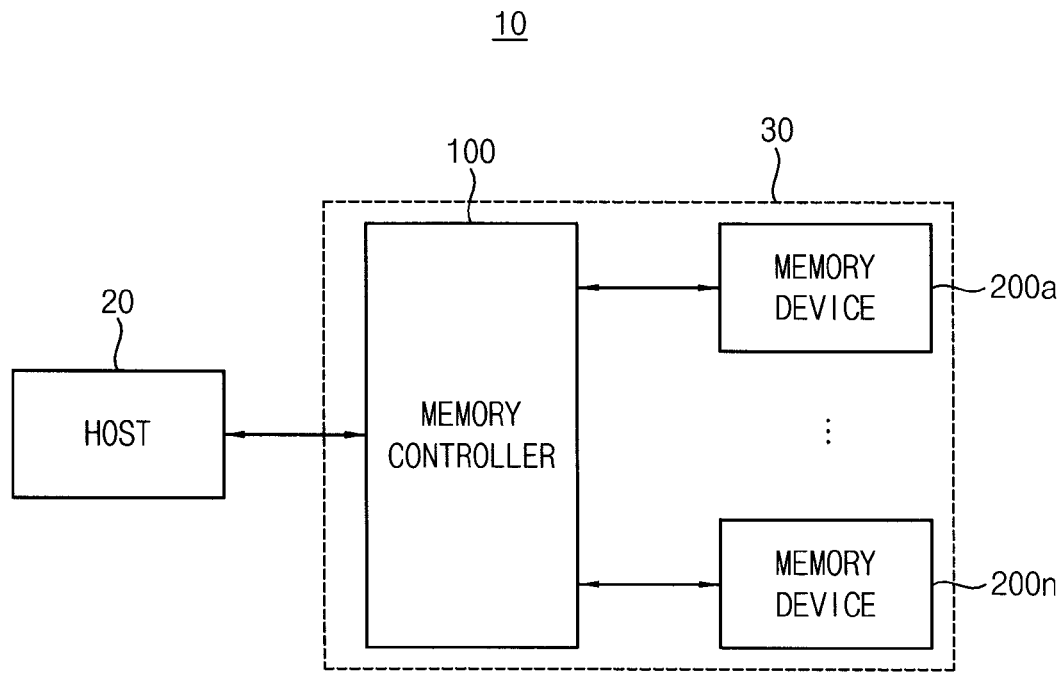
FIG. 1 is a block diagram illustrating an electronic system according to example embodiments.

Various example embodiments will be described more fully with reference to the accompanying drawings, in which some example embodiments are shown. The present disclosure may, however, be embodied in many different forms and should not be construed as limited to the embodiments set forth herein. Like reference numerals refer to like elements throughout this application.

It will be understood that, although the terms first, second, etc. may be used herein to describe various elements, these elements should not be limited by these terms. Unless the context indicates otherwise, these terms are used to distinguish one element from another, for example as a naming convention. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, or as contacting another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the present disclosure. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an electronic system according to example embodiments.

Referring to FIG. 1, an electronic system 10 includes a host 20 and a memory system 30. The memory system 30 includes a memory controller 100 and a plurality of memory devices 200a~200n. Here, n represents a positive integer.

The host 20 may communicate with the memory system 30 through an interface protocol such as Peripheral Component Interconnect-Express (PCI-E), Advanced Technology Attachment (ATA), Serial ATA (SATA), Parallel ATA (PATA), or serial attached SCSI (SAS). In addition, the host 20 may communicate with the memory system 30 through the interface protocol such as Universal Serial Bus (USB), Multi-Media Card (MMC), Enhanced Small Disk Interface (ESDI), or Integrated Drive Electronics (IDE).

The memory controller 100 controls an overall operation of the memory system 30. The memory controller 100 controls an overall data exchange between the host 20 and the memory devices 200a~200n. For example, the memory controller 100 writes data in the memory devices 200a~200n or reads data from the memory devices 200a~200n in response to a request from the host 20.

In addition, the memory controller 100 applies an operation command to the memory devices 200a~200n for controlling the memory devices 200a~200n.

In some embodiments, each of the memory devices 200a~200n may be a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), a Rambus dynamic random access memory (RDRAM), etc., or may be other volatile memory devices. Each of the memory devices may be, for example, a semiconductor chip, a stack of semiconductor chips, a semiconductor package including one or more semiconductor chips mounted on a package substrate, or a package-on-package semiconductor device.

Figure 2:
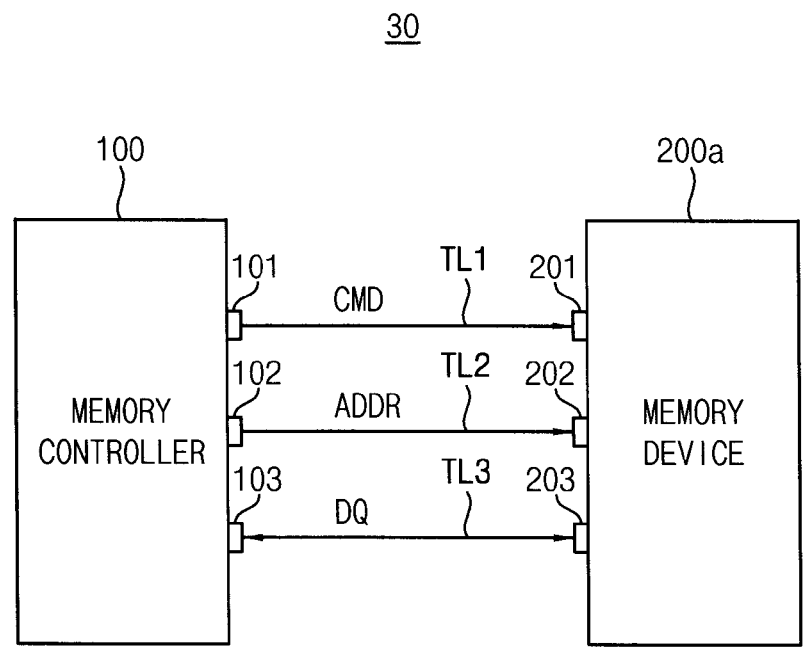
FIG. 2 is a block diagram illustrating an example of the memory system of FIG. 1 according to example embodiments.

FIG. 2 is a block diagram illustrating an example of the memory system of FIG. 1 according to example embodiments.

In FIG. 2, one memory device 200a corresponding to the memory controller 100 is illustrated for convenience.

Referring to FIG. 2, the memory system 30 includes the memory controller 100 and the memory device 200a. The memory controller 100 and the memory devices 200a may be connected to each other through corresponding command pins 101 and 201, corresponding address pins 102 and 202, and corresponding data pins 103 and 203. The command pins 101 and 201 transmit a command signal CMD through a command transmission line TL1, the address pins 102 and 202 transmit an address signal ADDR through an address transmission line TL2, and the data pins 103 and 203 exchange data DQ through a data transmission line TL3.

Referring to FIGS. 1 and 2, the memory controller 100 may provide a command to the memory device 200a through the command pins 101 and 201, provide an address to the memory device 200a through the address pins 102 and 202, and input data to the memory device 200a or output data from the memory device 200a through the data pins 103 and 203 based on the request from the host 20.

For example, in a read mode, the memory controller 100 may provide an active command and a row address to the memory device 200a through the command pins 101 and 201 and the address pins 102 and 202, respectively, and provide a read command and a column address to the memory device 200a through the command pins 101 and 201 and the address pins 102 and 202, respectively, after a row address-to-column address delay (tRCD). The memory device 200a may activate a memory cell row corresponding to the row address among a plurality of memory cell rows included in the memory device 200a in response to the active command, and provide read data stored in a memory cell corresponding to the column address of the activated memory cell row to the memory controller 100 through the data pins 103 and 203 in response to the read command.

In a write mode, the memory controller 100 may provide the active command and the row address to the memory device 200a through the command pins 101 and 201 and the address pins 102 and 202, respectively, and provide a write command and the column address to the memory device 200a through the command pins 101 and 201 and the address pins 102 and 202, respectively, after the row address-to-column address delay (tRCD). The memory controller 100 may provide write data to the memory device 200a through the data pins 103 and 203 after a write latency (tWL). The memory device 200a may activate the memory cell row corresponding to the row address among the plurality of memory cell rows included in the memory device 200a in response to the active command, and write the write data in the memory cell corresponding to the column address of the activated memory cell row in response to the write command.

Figure 3:
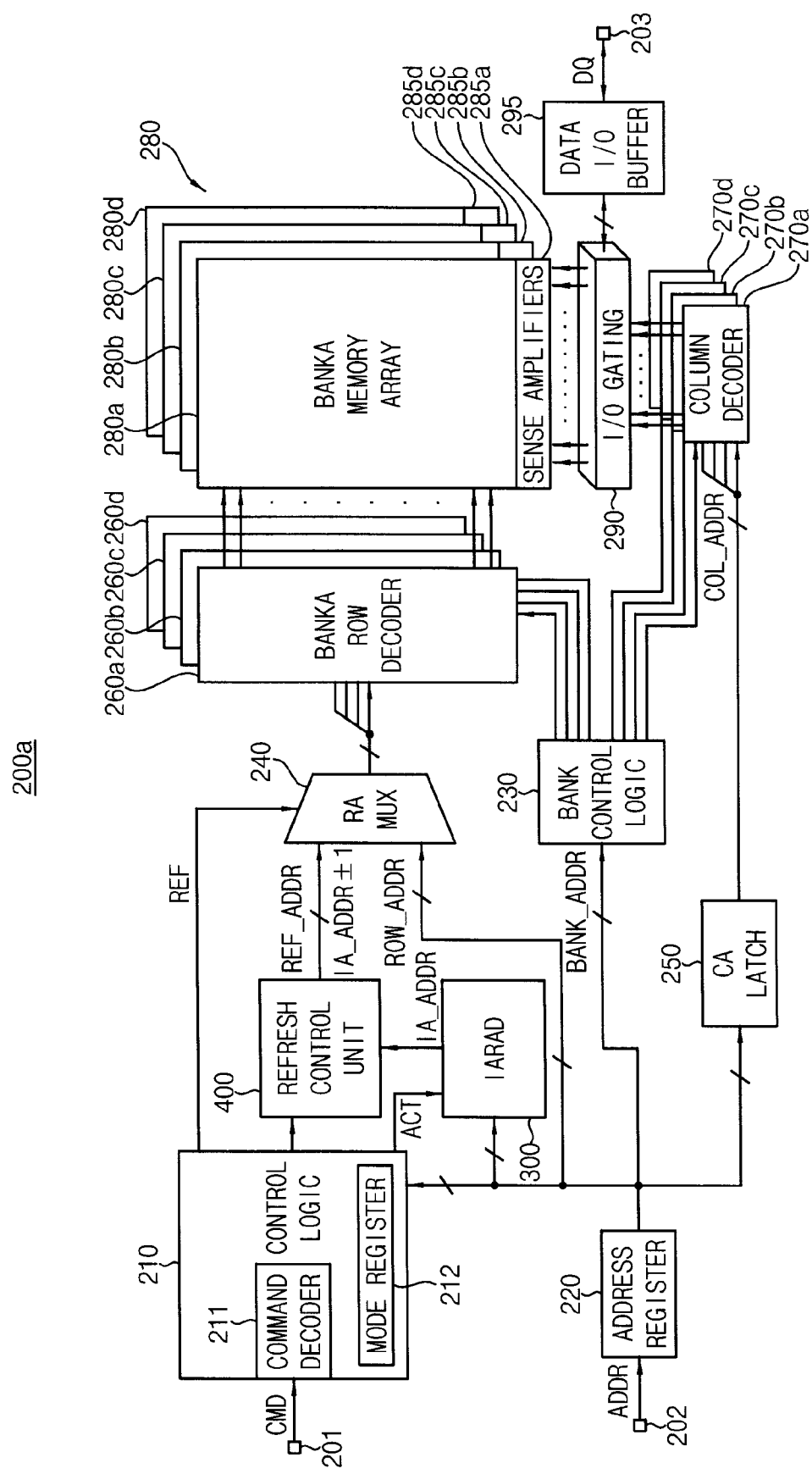
FIG. 3 is a block diagram illustrating an example of a memory device of FIG. 2 according to example embodiments.

FIG. 3 is a block diagram illustrating an example of the memory device of FIG. 2 according to example embodiments.

Referring to FIG. 3, the memory device 200a includes a control logic 210, an address register 220, a bank control logic 230, a row address multiplexer RA MUX 240, a column address latch CA LATCH 250, a row decoder, a column decoder, a memory cell array 280, a sense amplifier unit, an input/output gating circuit 290, a data input/output buffer 295, an intensively accessed row detection unit IARAD 300 and a refresh control unit 400.

The memory cell array 280 includes a plurality of memory cell rows. In some example embodiments, the memory cell array 280 may include first through fourth bank arrays 280a, 280b, 280c and 280d. Each of the first through fourth bank arrays 280a, 280b, 280c and 280d may include a plurality of memory cell rows.

The row decoder may include first through fourth bank row decoders 260a, 260b, 260c and 260d respectively coupled to the first through fourth bank arrays 280a, 280b, 280c and 280d. The column decoder may include first through fourth bank column decoders 270a, 270b, 270c and 270d respectively coupled to the first through fourth bank arrays 280a, 280b, 280c and 280d. The sense amplifier unit may include first through fourth bank sense amplifiers 285a, 285b, 285c and 285d respectively coupled to the first through fourth bank arrays 280a, 280b, 280c and 280d.

The first through fourth bank arrays 280a, 280b, 280c and 280d, the first through fourth bank row decoders 260a, 260b, 260c and 260d, the first through fourth bank column decoders 270a, 270b, 270c and 270d, and the first through fourth bank sense amplifiers 285a, 285b, 285c and 285d may form first through fourth banks Although the memory device 200a is illustrated in FIG. 3 as including four banks, the memory device 200a may include any number of banks The control logic 210 may control operations of the memory device 200a. For example, the control logic 210 may generate control signals for the memory device 200a to perform a write operation or a read operation. The control logic 210 may include a command decoder 211 that decodes the command signal CMD received from the memory controller 100 through the command pin 201 and a mode register 212 that is used to set an operation mode of the memory device 200a. For example, the command decoder 211 may generate an active signal ACT, a read signal, a write signal, etc., corresponding to the command signal CMD by decoding a write enable signal (/WE), a row address strobe signal (/RAS), a column address strobe signal (/CAS), a chip select signal (/CS), etc. The control logic 210 may further receive a clock signal (CLK) and a clock enable signal (/CKE) for operating the memory device 200a in a synchronous manner.

The address register 220 may receive the address signal ADDR including a bank address BANK_ADDR, a row address ROW_ADDR and a column address COL_ADDR from the memory controller 100 through the address pin 202. The address register 220 may provide the bank address BANK_ADDR to the bank control logic 230, provide the row address ROW_ADDR to the row address multiplexer 240 and the intensively accessed row detection unit 300, and provide the column address COL_ADDR to the column address latch 250. The row address ROW_ADDR may indicate one of the plurality of memory cell rows included in the memory cell array 280.

The bank control logic 230 may generate bank control signals in response to the bank address BANK_ADDR. One of the first through fourth bank row decoders 260a, 260b, 260c and 260d corresponding to the bank address BANK_ADDR may be activated in response to the bank control signals, and one of the first through fourth bank column decoders 270a, 270b, 270c and 270d corresponding to the bank address BANK_ADDR may be activated in response to the bank control signals.

The intensively accessed row detection unit 300, which may be a detection circuit, receives the active signal ACT from the control logic 210 and receives the row address ROW_ADDR from the address register 220. The intensively accessed row detection unit 300 generates an intensively accessed row address IA_ADDR indicating an intensively accessed memory cell row among the plurality of memory cell rows included in the memory cell array 280, for example, based on a sum of access time (e.g., an accumulated access time) for each of the plurality of memory cell rows.

In some example embodiments, the intensively accessed row detection unit 300 may generate the intensively accessed row address IA_ADDR based on a sum of time intervals (e.g., an amount of time intervals) for which the active signal ACT, which is received together with the row address ROW_ADDR indicating one of the plurality of memory cell rows included in the memory cell array 280, is activated for each of the plurality of memory cell rows.

A structure and an operation of the intensively accessed row detection unit 300 will be described later in detail with reference to FIG. 4.

The control logic 210 may control the row address multiplexer 240 such that the row address multiplexer 240 may perform a refresh operation. In addition, the control logic 210 may generate a refresh signal REF having an activated state while performing the refresh operation, and generate the refresh signal REF having a deactivated state after finishing the refresh operation.

The refresh control unit 400, which may be a control circuit, sequentially refreshes the plurality of memory cell rows included in the memory cell array 280 under a control of the control logic 210. When the refresh control unit 400 receives the intensively accessed row address IA_ADDR from the intensively accessed row detection unit 300, the refresh control unit 400 preferentially refreshes neighboring memory cell rows adjacent to the intensively accessed memory cell row, which is indicated by the intensively accessed row address IA_ADDR. As described herein, to be intensively accessed may depend on an amount of times a row is accessed, such as a frequency of access, an accumulated amount of time that a row is accessed, or a combination of both. The term "intensively accessed row" refers to a row that has been accessed substantially more than other rows based on, for example, an accumulated time of access and/or a number of accesses, and may refer to a row that has been accessed (in accumulated time and/or number of accesses) over a particular threshold amount.

In some example embodiments, the refresh control unit 400 may generate a refresh row address REF_ADDR that sequentially increases, and refresh a memory cell row corresponding to the refresh row address REF_ADDR. When the refresh control unit 400 receives the intensively accessed row address IA_ADDR from the intensively accessed row detection unit 300, the refresh control unit 400 may preferentially refresh a memory cell row corresponding to a row address that is less than the intensively accessed row address IA_ADDR by one, and a memory cell row corresponding to a row address that is greater than the intensively accessed row address IA_ADDR by one. Then, the refresh control unit 400 may refresh a memory cell row corresponding to the refresh row address REF_ADDR.

The row address multiplexer 240 may output one of the row address ROW_ADDR received from the address register 220 and an address received from the refresh control unit 400 in response to the refresh signal REF. For example, the row address multiplexer 240 may output the address received from the refresh control unit 400 when the refresh signal REF has an activated state, and output the row address ROW ADDR received from the address register 220 when the refresh signal REF has a deactivated state. A row address ROW_ADDR that is output from the row address multiplexer 240 may be applied to the first through fourth bank row decoders 260a, 260b, 260c and 260d.

The activated one of the first through fourth bank row decoders 260a, 260b, 260c and 260d may decode the row address ROW_ADDR received from the row address multiplexer 240 and activate a word-line corresponding to the row address ROW_ADDR received from the row address multiplexer 240. For example, the activated one of the first through fourth bank row decoders 260a, 260b, 260c and 260d may apply a word-line driving voltage to the word-line corresponding to the row address ROW_ADDR received from the row address multiplexer 240.

The column address latch 250 may receive the column address COL_ADDR from the address register 220 and temporarily store the column address COL_ADDR. In some embodiments, in a burst mode, the column address latch 250 may generate column addresses that increment from the column address COL_ADDR. The column address latch 250 may apply the temporarily stored or generated column address to the first through fourth bank column decoders 270a, 270b, 270c and 270d.

The activated one of the first through fourth bank column decoders 270a, 270b, 270c and 270d may decode the column address COL_ADDR received from the column address latch 250 and control the input/output gating circuit 290 to output data corresponding to the column address COL_ADDR.

The input/output gating circuit 290 may include a circuitry for gating input/output data. The input/output gating circuit 290 may further include an input data mask logic, read data latches for storing data received from the first through fourth bank arrays 280a, 280b, 280c and 280d, and write drivers for writing data to the first through fourth bank arrays 280a, 280b, 280c and 280d.

Data DQ to be read from one bank array of the first through fourth bank arrays 280a, 280b, 280c and 280d may be sensed by a sense amplifier coupled to the one bank array and be stored in the read data latches. The data DQ stored in the read data latches may be provided to the memory controller 100 through the data input/output buffer 295 and the data pin 203. Data DQ to be written to one bank array of the first through fourth bank arrays 280a, 280b, 280c and 280d may be provide from the memory controller 100 to the data input/output buffer 295 through the data pin 203. The data DQ provided to the data input/output buffer 295 may be written to the one bank array via the write drivers.

Figure 4:
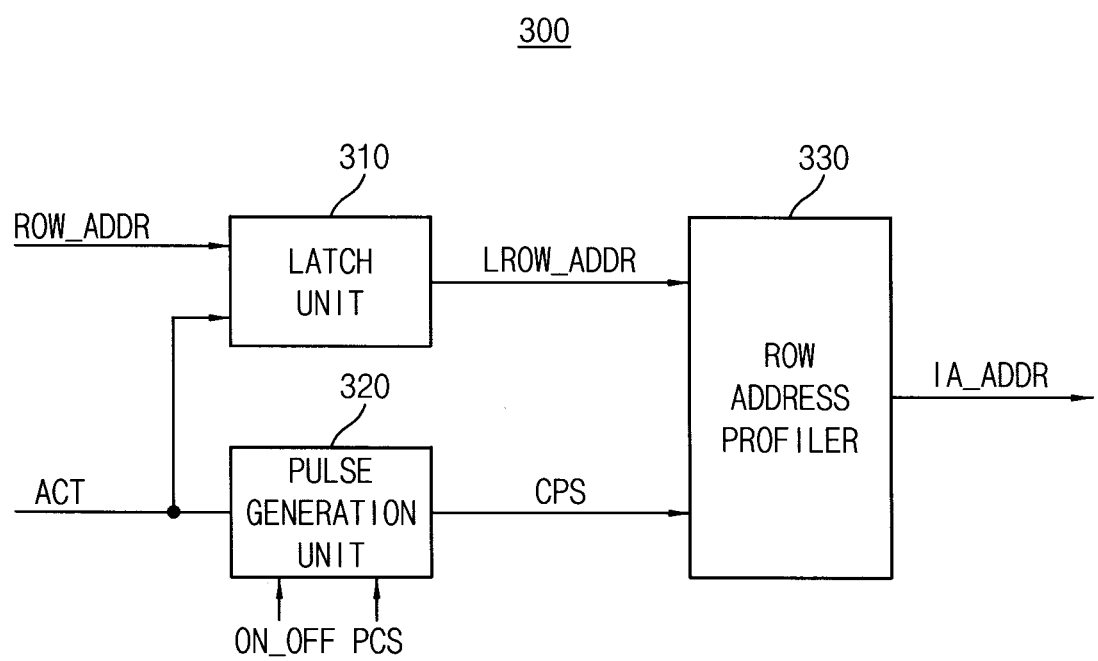
FIG. 4 is a block diagram illustrating an example of an intensively accessed row detection unit included in the memory device of FIG. 3.

FIG. 4 is a block diagram illustrating an example of an intensively accessed row detection unit included in the memory device of FIG. 3.

Referring to FIG. 4, the intensively accessed row detection unit 400 may include a latch unit 310 (e.g., latch circuit), a pulse generation unit 320 (e.g., pulse generation circuit) and a row address profiler 330 (e.g., row address profile circuit).

When the active signal ACT received from the control logic 210 is activated, the latch unit 310 may latch the row address ROW_ADDR received from the control logic 210 and output the latched address as a latched row address LROW_ADDR.

The pulse generation unit 320 may generate a count pulse signal CPS having a first period TP1 while the active signal ACT is activated.

Figure 5:
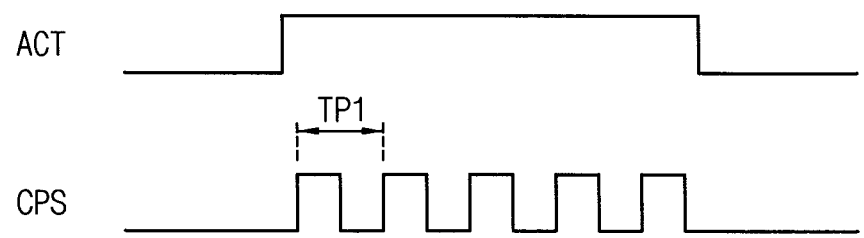
FIG. 5 is a diagram describing an exemplary operation of a pulse generation unit included in the intensively accessed row detection unit of FIG. 4.

FIG. 5 is a diagram describing an exemplary operation of a pulse generation unit included in the intensively accessed row detection unit of FIG. 4.

Referring to FIG. 5, the pulse generation unit 320 may generate the count pulse signal CPS having the first period TP1 when the active signal ACT received from the control logic 210 is activated to a logic high level, and stop generating the count pulse signal CPS when the active signal ACT received from the control logic 210 is deactivated to a logic low level.

In some example embodiments, the first period TP1 of the count pulse signal CPS generated from the pulse generation unit 320 may correspond to a row cycle time (tRC) of the memory device 200a.

In other example embodiments, the pulse generation unit 320 may adjust the first period TP1 of the count pulse signal CPS based on a period control signal PCS. The period control signal PCS may be provided from the control logic 210.

In some example embodiments, the pulse generation unit 320 may further receive an on-off signal ON_OFF. When the on-off signal ON_OFF has a first logic level, the pulse generation unit 320 may generate the count pulse signal CPS having the first period TP1 while the active signal ACT is activated. When the on-off signal ON_OFF has a second logic level, the pulse generation unit 320 may bypass the active signal ACT to output the active signal ACT as the count pulse signal CPS. In some example embodiments, the first logic level may be a logic high level, and the second logic level may be a logic low level. In other example embodiments, the first logic level may be a logic low level, and the second logic level may be a logic high level. The on-off signal ON_OFF may be provided from the control logic 210. In some example embodiments, the control logic 210 may generate the on-off signal ON_OFF based on a configuration value stored in the mode register 212. In other example embodiments, the control logic 210 may include at least one of a fuse circuit and an anti-fuse circuit, and generate the on-off signal ON_OFF based on a configuration value stored in the at least one of the fuse circuit and the anti-fuse circuit.

Figure 6A:
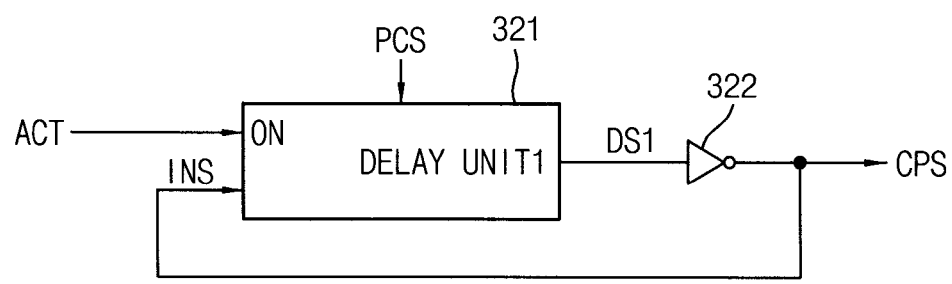
FIGS. 6A and 6B are block diagrams illustrating examples of the pulse generation unit included in the intensively accessed row detection unit of FIG. 4.
Figure 6B:
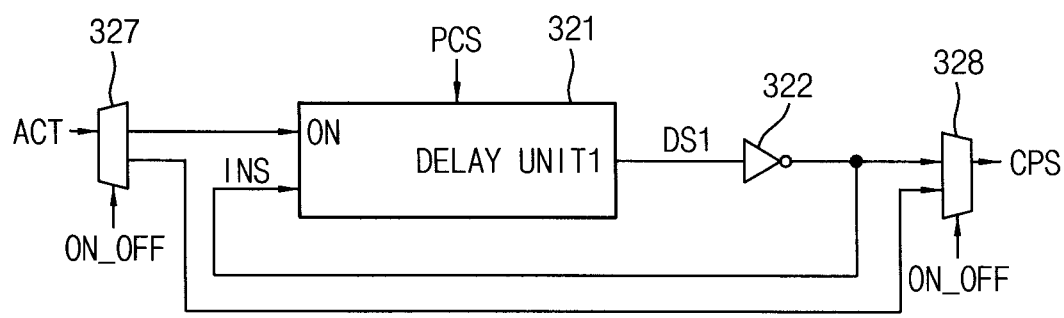

FIGS. 6A and 6B are block diagrams illustrating examples of a pulse generation unit included in the intensively accessed row detection unit of FIG. 4.

Referring to FIG. 6A, a pulse generation unit 320a-1 may include a first delay unit 321 and a first inverter 322.

The first delay unit 321 (e.g., delay circuit) may be turned on while the active signal ACT is activated and be turned off while the active signal ACT is deactivated. While the first delay unit 321 is turned on, the first delay unit 321 may generate a first delay signal DS1 by delaying an input signal INS for a delay time. The delay time may correspond, for example, to a half of the first period TP1. The first delay unit 321 may output the first delay signal DS1 having a logic low level at an initial stage after the first delay unit 321 is turned on.

The first inverter 322 may generate the count pulse signal CPS by inverting the first delay signal DS1 and provide the count pulse signal CPS to the first delay unit 321 as the input signal INS.

Therefore, the first delay signal DS1 generated from the first delay unit 321 may toggle every half of the first period TP1. As such, as illustrated in FIG. 5, the pulse generation unit 320a-1 may output the count pulse signal CPS having the first period TP1 through the first inverter 322.

In some example embodiments, the first delay unit 321 may adjust a length of the delay time based on the period control signal PCS. In this case, the first period TP1 of the count pulse signal CPS generated from the first inverter 322 may be changed based on the period control signal PCS.

Referring to FIG. 6B, a pulse generation unit 320a-2 may include the first delay unit 321, the first inverter 322, a demultiplexer 327 and a multiplexer 328.

The first delay unit 321 and the first inverter 322 included in the pulse generation unit 320a-2 of FIG. 6B may be the same as the first delay unit 321 and the first inverter 322 included in the pulse generation unit 320a-1 of FIG. 6A.

The demultiplexer 327 may provide the active signal ACT to one of the first delay unit 321 and the multiplexer 328 based on a logic level of the on-off signal ON_OFF.

The multiplexer 328 may output one of a signal received from the first inverter 322 and the active signal ACT received from the demultiplexer 327 as the count pulse signal CPS based on the logic level of the on-off signal ON_OFF.

When the on-off signal ON_OFF has a first logic level, the demultiplexer 327 may provide the active signal ACT to the first delay unit 321 and the multiplexer 328 may output the signal received from the first inverter 322 as the count pulse signal CPS. In this case, the pulse generation unit 320a-2 of FIG. 6B may operate substantially the same as the pulse generation unit 320a-1 of FIG. 6A.

When the on-off signal ON_OFF has a second logic level, the demultiplexer 327 may provide the active signal ACT to the multiplexer 328 and the multiplexer 328 may output the active signal ACT received from the demultiplexer 327 as the count pulse signal CPS. In this case, the pulse generation unit 320a-2 of FIG. 6B may bypass the active signal ACT to output the active signal ACT as the count pulse signal CPS.

Figure 7A:
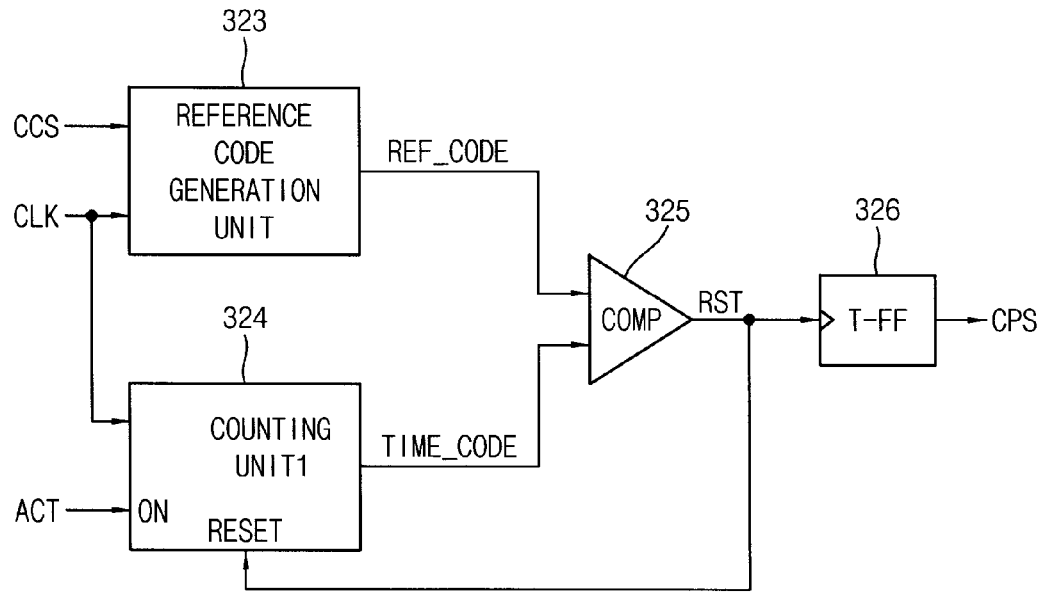
FIGS. 7A and 7B are block diagrams illustrating other examples of the pulse generation unit included in the intensively accessed row detection unit of FIG. 4.
Figure 7B:
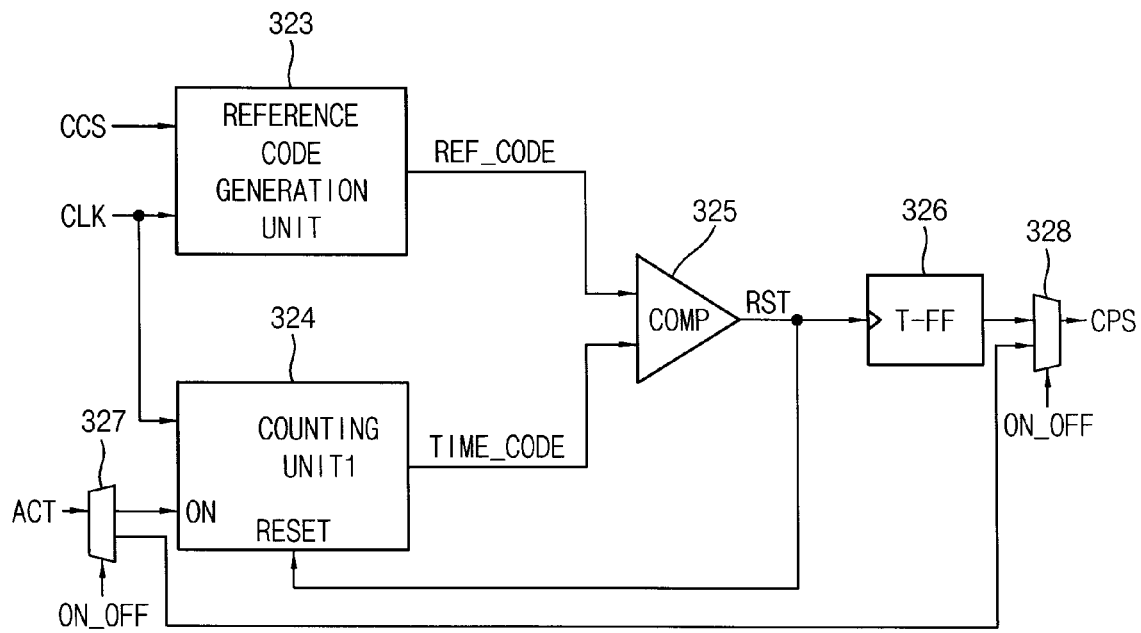

FIGS. 7A and 7B are block diagrams illustrating other examples of a pulse generation unit (e.g., circuit) included in the intensively accessed row detection unit of FIG. 4.

Referring to FIG. 7A, a pulse generation unit 320b-1 may include a reference code generation unit 323 (e.g., reference code generation circuit), a first counting unit 324 (e.g., first counting circuit), a comparator 325 and a toggle flip flop T-FF 326.

The reference code generation unit 323 may generate a reference code REF_CODE that is proportional to a frequency of a clock signal CLK in response to a clock change signal CCS.

The clock signal CLK and the clock change signal CCS may be provided from the control logic 210. The memory device 200a may use the clock signal CLK to operate in a synchronous manner. When the frequency of the clock signal CLK is changed, the control logic 210 may activate the clock change signal CCS for a predetermined time.

Figure 8:
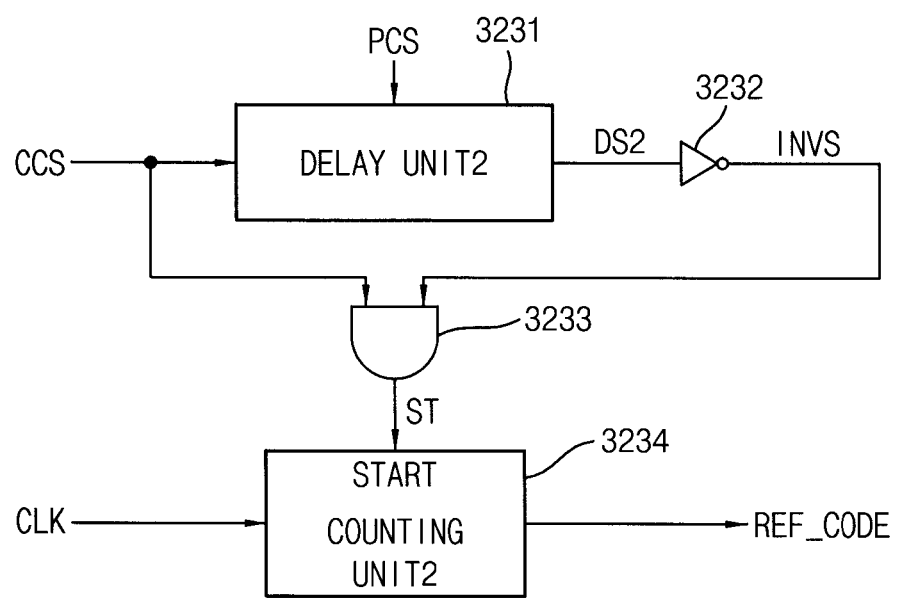
FIG. 8 is a block diagram illustrating an example of a reference code generation unit included in the pulse generation unit of FIGS. 7A and 7B.

FIG. 8 is a block diagram illustrating an example of a reference code generation unit included in the pulse generation unit of FIG. 7A.

Referring to FIG. 8, the reference code generation unit 323 may include a second delay unit 3231 (e.g., second delay circuit), a second inverter 3232, an AND gate 3233 and a second counting unit 3234 (e.g., second counting circuit).

The second delay unit 3231 may generate a second delay signal DS2 by delaying the clock change signal CCS for a delay time. The delay time may correspond, for example, to a half of the first period TP1.

In some example embodiments, the second delay unit 3231 may adjust a length of the delay time based on the period control signal PCS.

The second inverter 3232 may generate an inverted signal INVS by inverting the second delay signal DS2.

The AND gate 3233 may perform an AND operation on the clock change signal CCS and the inverted signal INVS to generate a start signal ST.

When the start signal ST is activated to the logic high level, the second counting unit 3234 may reset a count value and perform an up-count operation on the count value in synchronization with the clock signal CLK. When the start signal ST is deactivated to the logic low level, the second counting unit 3234 may stop performing the up-count operation and output the count value as the reference code REF CODE.

Figure 9:
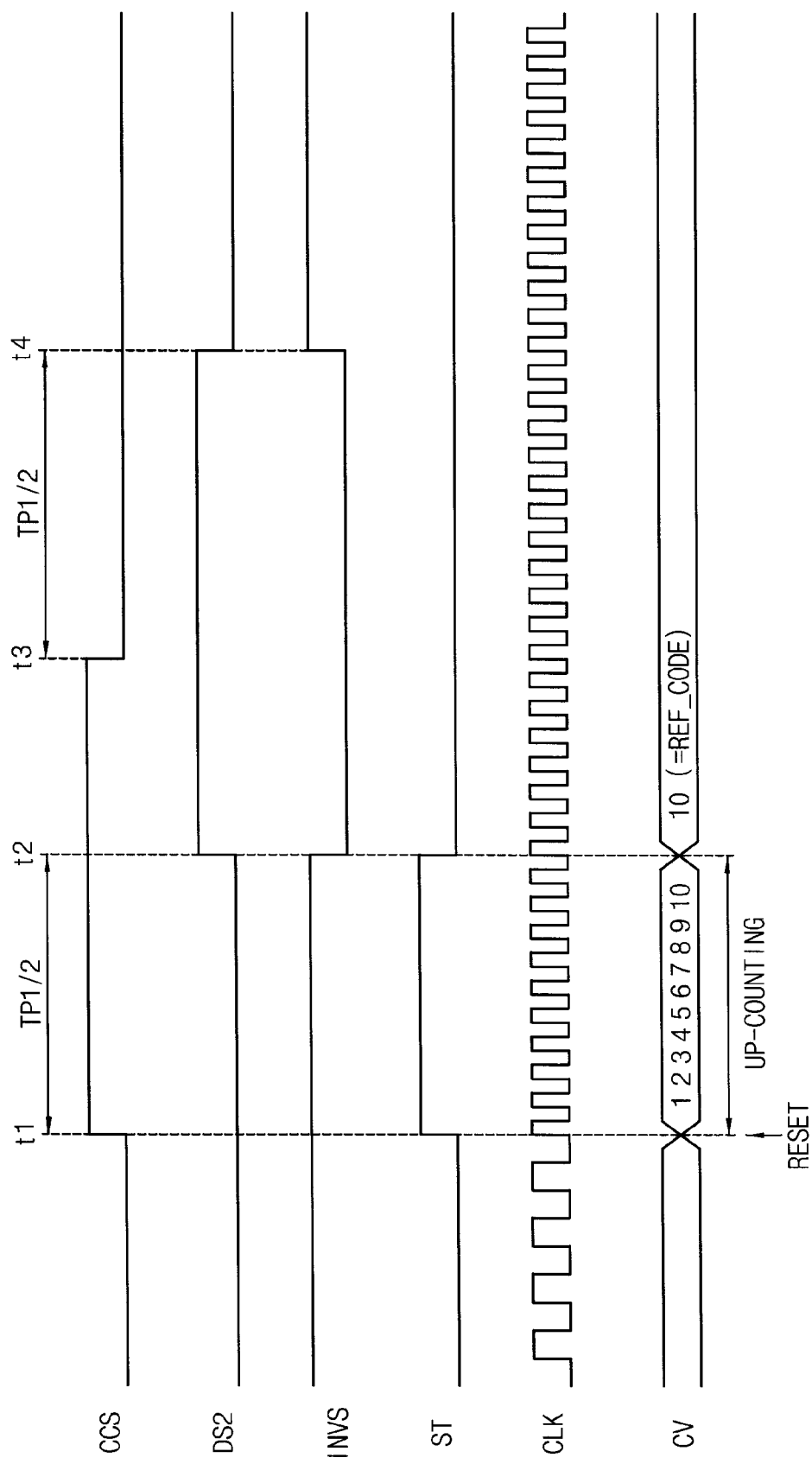
FIG. 9 is a diagram describing an exemplary operation of the reference code generation unit of FIG. 8.

FIG. 9 is a diagram describing an operation of the reference code generation unit of FIG. 8.

Referring to FIG. 9, before a first time t1, the control logic 210 may generate the clock signal CLK having a constant frequency and the clock change signal CCS deactivated to the logic low level. Therefore, the second delay signal DS2 generated from the second delay unit 3231 may be maintained at the logic low level, and the inverted signal INVS generated from the second inverter 3232 may be maintained at the logic high level. Since the clock change signal CCS has the logic low level and the inverted signal INVS has the logic high level, the start signal ST may be maintained at the logic low level.

At the first time t1, the frequency of the clock signal CLK may change such that the control logic 210 may activate the clock change signal CCS to the logic high level. Therefore, the start signal ST may be activated to the logic high level such that the second counting unit 3234 may reset the count value CV and perform the up-count operation on the count value CV in synchronization with the clock signal CLK.

Since the second delay unit 3231 generates the second delay signal DS2 by delaying the clock change signal CCS for the delay time, as illustrated in FIG. 9, the second delay signal DS2 may change to the logic high level at a second time t2. The difference between the second time t2 and the first time t1, which corresponds to the delay time, may correspond to a half of the first period TP1. Therefore, at the second time t2, the inverted signal INVS generated from the second inverter 3232 may change to the logic low level such that the start signal ST may be deactivated to the logic low level. As such, the second counting unit 3234 may stop performing the up-count operation and output the count value CV as the reference code REF_CODE. For example, in an example of FIG. 9, since the second counting unit 3234 receives ten cycles of the clock signal CLK while the start signal ST is activated, the second counting unit 3234 may generate the reference code REF CODE having a value of ten at the second time t2.

At a third time t3, the control logic 210 may deactivate the clock change signal CCS to the logic low level. Therefore, at a fourth time t4, which is the delay time behind from the third time t3, the second delay signal DS2 may change to the logic low level and the inverted signal INVS may change to the logic high level.

The second counting unit 3234 may continuously output the reference code REF_CODE having a value of ten from the second time t2 until the frequency of the clock signal CLK is changed and the clock change signal CCS is activated to the logic high level.

As described above with reference to FIGS. 8 and 9, the reference code generation unit 323 may receive the clock signal CLK that is internally used by the memory device 200a and generate the reference code REF_CODE that is proportional to the frequency of the clock signal CLK.

Referring again to FIG. 7A, the first counting unit 324 may be turned on while the active signal ACT is activated, and the first counting unit 324 may be turned off while the active signal ACT is deactivated. While the first counting unit 324 is turned on, the first counting unit 324 may generate a time code TIME_CODE by performing an up-count operation in synchronization with the clock signal CLK, and reset the time code TIME_CODE in response to a rising edge of a reset signal RST.

The comparator 325 may generate the reset signal RST by comparing the time code TIME_CODE received from the first counting unit 324 with the reference code REF_CODE received from the reference code generation unit 323. For example, the comparator 325 may output the reset signal RST having the logic low level when the time code TIME_CODE is less than the reference code REF_CODE, and output the reset signal RST having the logic high level when the time code TIME_CODE is equal to or greater than the reference code REF_CODE.

The toggle flip flop 326 may generate an output signal toggling in response to the rising edge of the reset signal RST and output the output signal as the count pulse signal CPS.

As described above with reference to FIGS. 8 and 9, the reference code REF_CODE may represent a number of cycles of the clock signal CLK received during a time corresponding to a half of the first period TP1. Therefore, the reset signal RST that is output from the comparator 325 may be activated to the logic high level every half of the first period TP1. Since the toggle flip flop 326 toggles the count pulse signal CPS in response to the rising edge of the reset signal RST, as illustrated in FIG. 5, the pulse generation unit 320b-1 may output the count pulse signal CPS having the first period TP1 through the toggle flip flop 326.

Referring to FIG. 7B, a pulse generation unit 320b-2 may include the reference code generation unit 323, the first counting unit 324, the comparator 325, the toggle flip flop T-FF 326, a demultiplexer 327 and a multiplexer 328.

The reference code generation unit 323, the first counting unit 324, the comparator 325 and the toggle flip flop 326 included in the pulse generation unit 320b-2 of FIG. 7B may be the same as the reference code generation unit 323, the first counting unit 324, the comparator 325 and the toggle flip flop 326 included in the pulse generation unit 320b-1 of FIG. 7A.

The demultiplexer 327 may provide the active signal ACT to one of the first counting unit 324 and the multiplexer 328 based on a logic level of the on-off signal ON_OFF.

The multiplexer 328 may output one of a signal received from the toggle flip flop 326 and the active signal ACT received from the demultiplexer 327 as the count pulse signal CPS based on a logic level of the on-off signal ON_OFF.

When the on-off signal ON_OFF has a first logic level, the demultiplexer 327 may provide the active signal ACT to the first counting unit 324 and the multiplexer 328 may output the signal received from the toggle flip flop 326 as the count pulse signal CPS. In this case, the pulse generation unit 320b-2 of FIG. 7B may operate substantially the same as the pulse generation unit 320b-1 of FIG. 7A.

When the on-off signal ON_OFF has a second logic level, the demultiplexer 327 may provide the active signal ACT to the multiplexer 328 and the multiplexer 328 may output the active signal ACT received from the demultiplexer 327 as the count pulse signal CPS. In this case, the pulse generation unit 320b-2 of FIG. 7B may bypass the active signal ACT to output the active signal ACT as the count pulse signal CPS.

Referring again to FIG. 4, the row address profiler 330 may store access values corresponding to the plurality of memory cell rows, respectively, that are included in the memory cell array 280. The row address profiler 330 may receive the latched row address LROW_ADDR from the latch unit 310 and receive the count pulse signal CPS received from the pulse generation unit 320. The row address profiler 330 may sequentially increase one of the access values, which corresponds to the latched row address LROW_ADDR, in synchronization with the count pulse signal CPS. The row address profiler 330 may generate the intensively accessed row address IA_ADDR based on the access values.

In some example embodiments, at every predetermined time interval, the row address profiler 330 may output a row address, which corresponds to a greatest access value among the access values, as the intensively accessed row address IA_ADDR, and the row address profiler 330 may reset the access values. In this case, the predetermined time interval may be shorter than a refresh period of the memory cell array 280 during which the plurality of memory cell rows included in the memory cell array 280 are refreshed.

In other example embodiments, when each of the access values exceeds a threshold value, the row address profiler 330 may output a row address, which corresponds to an access value exceeding the threshold value among the access values, as the intensively accessed row address IA_ADDR together with an interrupt signal. In addition, the row address profiler 330 may reset the access values at every predetermined time interval. In this case, the predetermined time interval may correspond to the refresh period of the memory cell array 280 during which the plurality of memory cell rows included in the memory cell array 280 are refreshed.

Figure 10:
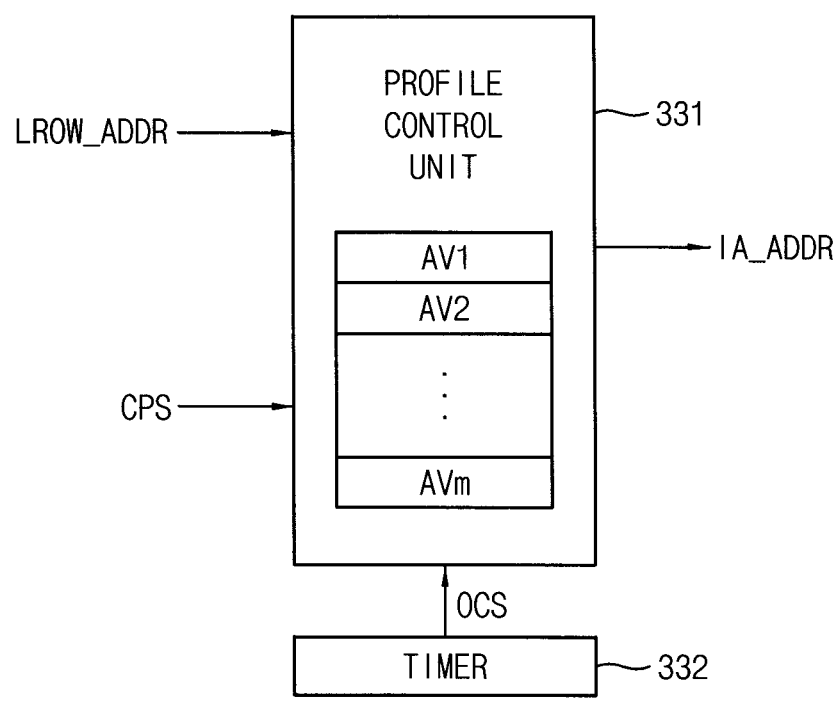
FIG. 10 is a block diagram illustrating an example of a row address profiler included in the intensively accessed row detection unit of FIG. 4.

FIG. 10 is a block diagram illustrating an example of a row address profiler included in the intensively accessed row detection unit of FIG. 4.

Referring to FIG. 10, a row address profiler 330a may include a profile control unit 331 (e.g., profile control circuit) and a timer 332.

The profile control unit 331 may store the access values AV1, AV2, ..., AVm corresponding to the plurality of memory cell rows, respectively, that are included in the memory cell array 280. Here, m represents a positive integer.

The profile control unit 331 may receive the latched row address LROW_ADDR from the latch unit 310 and receive the count pulse signal CPS received from the pulse generation unit 320. The profile control unit 331 may select one of the access values AV1, AV2, ..., AVm, which corresponds to the latched row address LROW_ADDR, and perform an up-count operation on the selected access value in synchronization with the count pulse signal CPS.

The timer 332 may generate an output control signal OCS at every predetermined time interval. In one embodiment, the predetermined time interval may be shorter than a refresh period of the memory cell array 280 during which the plurality of memory cell rows included in the memory cell array 280 are refreshed.

When the profile control unit 331 receives the output control signal OCS from the timer 332, the profile control unit 331 may output a row address, which corresponds to a greatest access value among the access values AV1, AV2, ..., AVm, as the intensively accessed row address IA_ADDR, and the profile control unit 331 may reset the access values AV1, AV2, ..., AVm.

Therefore, the row address profiler 330a of FIG. 10 may output a row address corresponding to a memory cell row, which is accessed for the longest time among the plurality of memory cell rows included in the memory cell array 280, as the intensively accessed row address IA_ADDR at every predetermined time interval.

Figure 11:
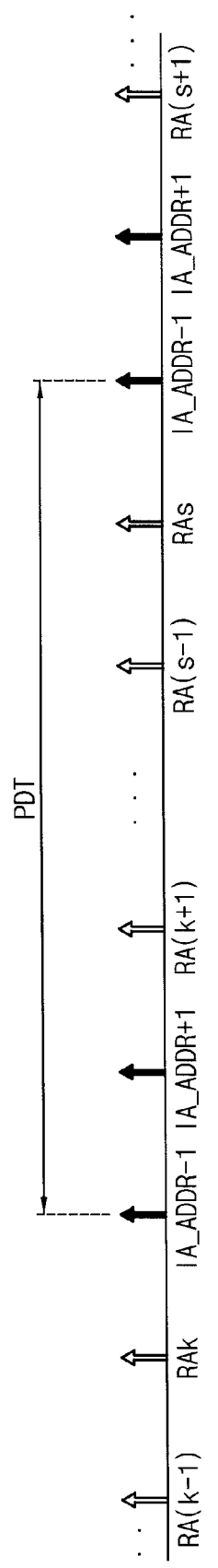
FIG. 11 is a diagram describing an exemplary operation of a refresh control unit included in the memory device of FIG. 3 when the intensively accessed row detection unit included in the memory device of FIG. 3 includes the row address profiler of FIG. 10.

FIG. 11 is a diagram describing an exemplary operation of a refresh control unit included in the memory device of FIG. 3 when the intensively accessed row detection unit included in the memory device of FIG. 3 includes the row address profiler of FIG. 10.

Referring to FIGS. 3 and 11, the refresh control unit 400 may generate row addresses RA(k−1), RAk, RA(k+1), ..., RA(s−1), RAs, RA(S+1), which increase sequentially, as the refresh row address REF_ADDR, and the refresh control unit 400 may refresh a memory cell row corresponding to the refresh row address REF_ADDR. Here, k and s represent positive integers.

As described above, the refresh control unit 400 may receive the intensively accessed row address IA_ADDR from the row address profiler 330a at every predetermined time interval PDT. As illustrated in FIG. 11, when the refresh control unit 400 receives the intensively accessed row address IA_ADDR from the row address profiler 330a, the refresh control unit 400 may preferentially refresh a memory cell row corresponding to a row address that is less than the intensively accessed row address IA_ADDR by one, and a memory cell row corresponding to a row address that is greater than the intensively accessed row address IA_ADDR by one. Then, the refresh control unit 400 may refresh a memory cell row corresponding to the refresh row address REF_ADDR.

Figure 12:
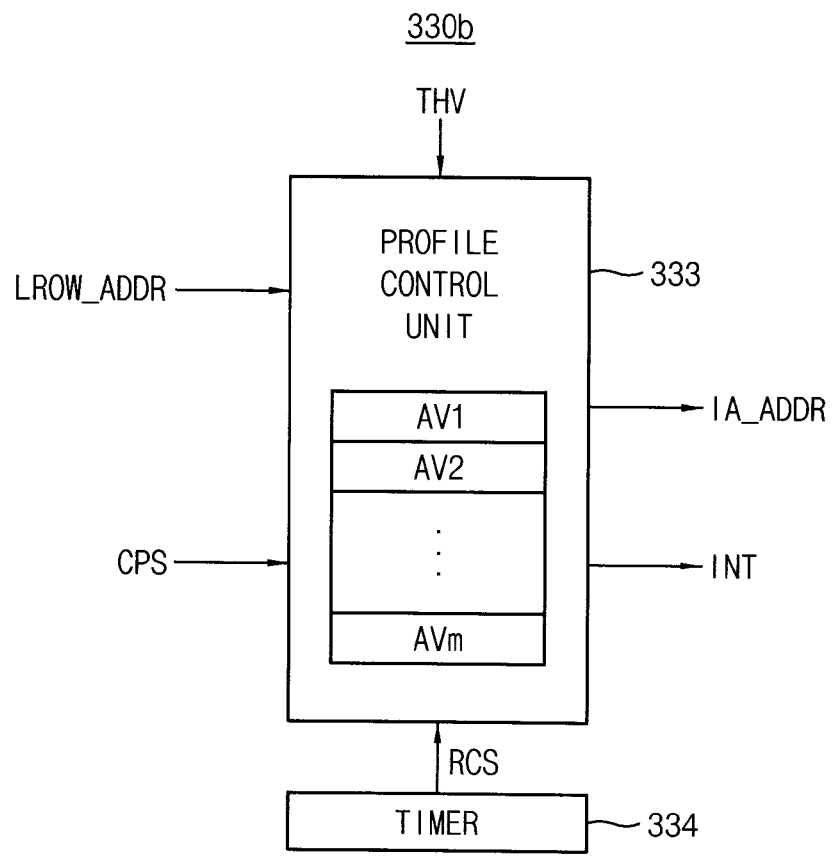
FIG. 12 is a block diagram illustrating another example of the row address profiler included in the intensively accessed row detection unit of FIG. 4.

FIG. 12 is a block diagram illustrating another example of the row address profiler included in the intensively accessed row detection unit of FIG. 4.

Referring to FIG. 12, a row address profiler 330b may include a profile control unit 333 and a timer 334.

The profile control unit 333 may store the access values AV1, AV2, ..., AVm corresponding to the plurality of memory cell rows, respectively, that are included in the memory cell array 280. Here, m represents a positive integer.

The profile control unit 333 may receive the latched row address LROW_ADDR from the latch unit 310 and receive the count pulse signal CPS received from the pulse generation unit 320. The profile control unit 333 may select one of the access values AV1, AV2, ..., AVm, which corresponds to the latched row address LROW_ADDR, and perform an up-count operation on the selected access value in synchronization with the count pulse signal CPS.

When each of the access values AV1, AV2, ..., AVm exceeds a threshold value THV, the profile control unit 333 may output a row address, which corresponds to an access value exceeding the threshold value THV among the access values AV1, AV2, ..., AVm, as the intensively accessed row address IA ADDR together with the interrupt signal INT. In some example embodiments, the profile control unit 333 may store the threshold value THV internally. In other example embodiments, the threshold value THV may be provided from the control logic 210.

The timer 334 may generate a reset control signal RCS at every predetermined time interval. The predetermined time interval may correspond to a refresh period of the memory cell array 280 during which the plurality of memory cell rows included in the memory cell array 280 are refreshed.

When the profile control unit 333 receives the reset control signal RCS from the timer 334, the profile control unit 333 may reset the access values AV1, AV2, ..., AVm.

Therefore, when a certain memory cell row among the plurality of memory cell rows included in the memory cell array 280 is accessed for a time longer than a period corresponding to the threshold value THV during the refresh period of the memory cell array 280, the row address profiler 330b of FIG. 12 may immediately output a row address corresponding to the certain memory cell row as the intensively accessed row address IA_ADDR together with the interrupt signal INT.

Figure 13:
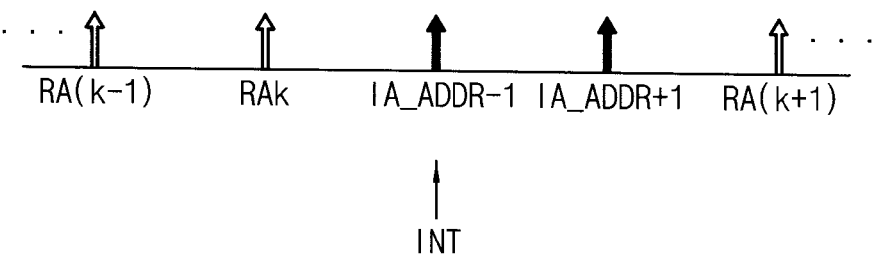
FIG. 13 is a diagram describing an exemplary operation of the refresh control unit included in the memory device of FIG. 3 when the intensively accessed row detection unit included in the memory device of FIG. 3 includes the row address profiler of FIG. 12.

FIG. 13 is a diagram describing an exemplary operation of a refresh control unit included in the memory device of FIG. 3 when the intensively accessed row detection unit included in the memory device of FIG. 3 includes the row address profiler of FIG. 12.

Referring to FIGS. 3 and 13, the refresh control unit 400 may generate row addresses RA(k−1), RAk, RA(k+1), which increase sequentially, as the refresh row address REF_ADDR, and refresh a memory cell row corresponding to the refresh row address REF_ADDR.

As illustrated in FIG. 13, when the refresh control unit 400 receives the interrupt signal INT and the intensively accessed row address IA_ADDR from the row address profiler 330b, the refresh control unit 400 may preferentially refresh a memory cell row corresponding to a row address that is less than the intensively accessed row address IA_ADDR by one, and a memory cell row corresponding to a row address that is greater than the intensively accessed row address IA_ADDR by one. Then, the refresh control unit 400 may refresh a memory cell row corresponding to the refresh row address REF_ADDR.

If the intensively accessed memory cell row is determined based on an access frequency of memory cell rows included in a memory cell array, a memory cell row, which is accessed for a long time during each access but has a low access frequency, may not be determined as the intensively accessed memory cell row.

However, as described above, the memory device 200a according to example embodiments generates the intensively accessed row address IA_ADDR indicating the intensively accessed memory cell row among the plurality of memory cell rows included in the memory cell array 280 based on a sum of access time for each of the plurality of memory cell rows. The memory device 200a preferentially refreshes neighboring memory cell rows adjacent to the intensively accessed memory cell row, which is indicated by the intensively accessed row address IA_ADDR.

Therefore, the memory device 200a may preferentially refresh neighboring memory cell rows adjacent to a certain memory cell row when the certain memory cell row is accessed for a long time during each access with a low access frequency as well as when the certain memory cell row is accessed frequently.

In addition, according to example embodiments, the pulse generation unit 320 included in the intensively accessed row detection unit 300 may adjust the first period TP1 of the count pulse signal CPS based on the period control signal PCS. Therefore, the memory device 200a may adjust weight values of an access frequency and a sum of access time for each of the plurality of memory cell rows, which are used in determining the intensively accessed memory cell row, by changing the first period TP1 of the count pulse signal CPS using the period control signal PCS. For example, a higher weight value may be applied to the access frequency than the sum of access time when the first period TP1 of the count pulse signal CPS increases. On the other hand, the higher weight value may be applied to the sum of access time than the access frequency when the first period TP1 of the count pulse signal CPS decreases.

Therefore, the memory device 200a may effectively reduce a rate of data loss.

Figure 14:
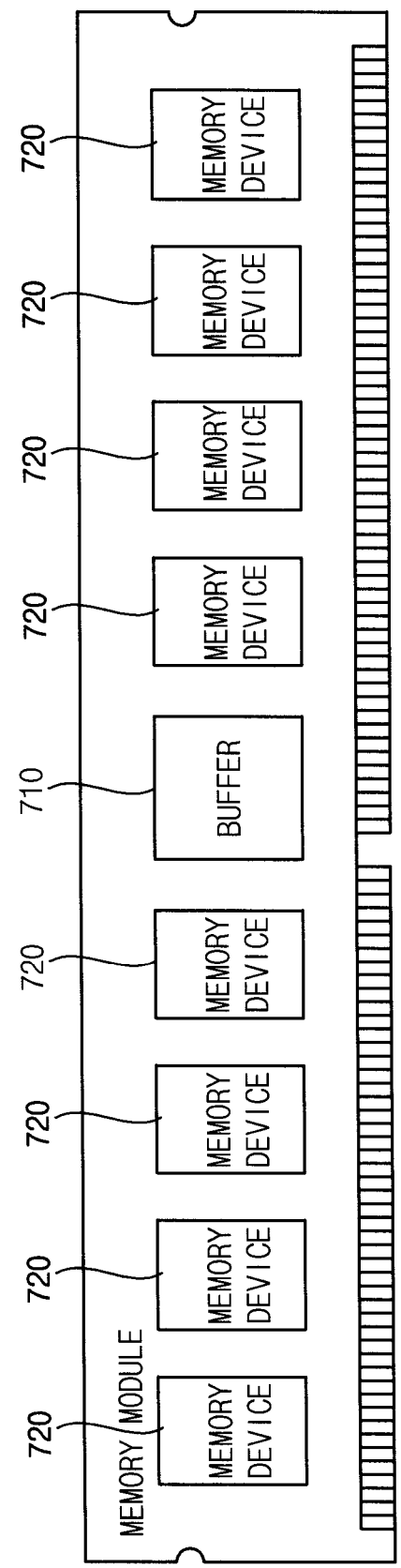
FIG. 14 is a block diagram illustrating a memory module according to exemplary embodiments.

FIG. 14 is a block diagram illustrating a memory module according to exemplary embodiments.

Referring to FIG. 14, a memory module 700 may include a plurality of memory devices 720. In some embodiments, the memory module 700 may be an unbuffered dual in-line memory module (UDIMM), a registered dual in-line memory module (RDIMM), a fully buffered dual in-line memory module (FBDIMM), a load reduced dual in-line memory module (LRDIMM), etc.

The memory module 700 may further include a buffer 710 that receives a command signal, an address signal and data from a memory controller through a plurality of transmission lines and buffers the command signal, the address signal and the data to provide the plurality of memory devices 720 with the command signal, the address signal and the data.

In some example embodiments, data transmission lines between the buffer 710 and the plurality of memory devices 720 may be coupled in a point-to-point topology. Command transmission lines and address transmission lines between the buffer 710 and the plurality of memory devices 720 may be coupled in a multi-drop topology, a daisy-chain topology, a fly-by daisy-chain topology, or the like. Since the buffer 710 buffers the command signal, the address signal and the data, the memory controller may interface with the memory module 700 by driving only a load of the buffer 710. Accordingly, the memory module 700 may include more memory devices 720 and/or more memory ranks, and a memory system may include more memory modules 700. For ease of description, each of the various devices or systems described herein may be referred to as an electronic device.

The memory device 720 may generate an intensively accessed row address indicating an intensively accessed memory cell row among a plurality of memory cell rows included in a memory cell array based on a sum of access time for each of the plurality of memory cell rows, and the memory device 720 may preferentially refresh neighboring memory cell rows adjacent to the intensively accessed memory cell row, which is indicated by the intensively accessed row address. Therefore, the memory device 720 may preferentially refresh neighboring memory cell rows adjacent to a certain memory cell row when the certain memory cell row is accessed for a long time during each access with a low access frequency as well as when the certain memory cell row is accessed frequently. As such, the memory device 720 may effectively reduce a rate of data loss.

The memory device 720 may be embodied with the memory device 200a of FIG. 3. A structure and an operation of the memory device 200a are described above with reference to FIGS. 3 to 13. Therefore, a detailed description of the memory device 720 will be omitted.

Figure 15:
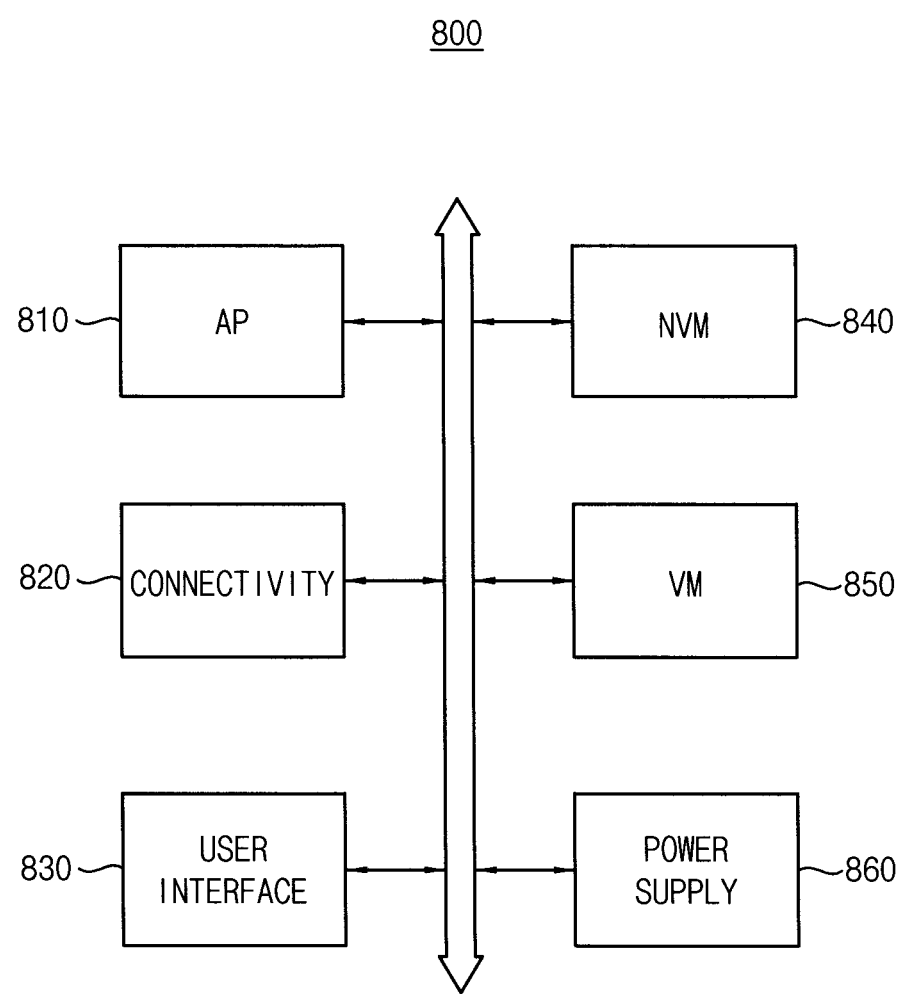
FIG. 15 is a block diagram illustrating a mobile system according to exemplary embodiments.

FIG. 15 is a block diagram illustrating a mobile system according to exemplary embodiments.

Referring to FIG. 15, a mobile system 800 includes an application processor 810, a connectivity unit 820, a user interface 830, a nonvolatile memory device NVM 840, a volatile memory device VM 850 and a power supply 860. In some embodiments, the mobile system 800 may be a mobile phone, a smart phone, a personal digital assistant (PDA), a portable multimedia player (PMP), a digital camera, a music player, a portable game console, a navigation system, etc.

The application processor 810 may execute applications, such as a web browser, a game application, a video player, etc. In some embodiments, the application processor 810 may include a single core or multiple cores. For example, the application processor 810 may be a multi-core processor, such as a dual-core processor, a quad-core processor, a hexa-core processor, etc. The application processor 810 may include an internal or external cache memory.

The connectivity unit 820 may perform wired or wireless communication with an external device. For example, the connectivity unit 820 may perform Ethernet communication, near field communication (NFC), radio frequency identification (RFID) communication, mobile telecommunication, memory card communication, universal serial bus (USB) communication, etc. In some embodiments, the connectivity unit 820 may include a baseband chipset that supports communications, such as a global system for mobile communications (GSM), general packet radio service (GPRS), wideband code division multiple access (WCDMA), high speed downlink/uplink packet access (HSxPA), etc.

The volatile memory device 850 may store data processed by the application processor 810, or may operate as a working memory. The volatile memory device 850 may generate an intensively accessed row address indicating an intensively accessed memory cell row among a plurality of memory cell rows included in a memory cell array based on a sum of access time for each of the plurality of memory cell rows, and the volatile memory device 850 may preferentially refresh neighboring memory cell rows adjacent to the intensively accessed memory cell row, which is indicated by the intensively accessed row address. Therefore, the volatile memory device 850 may preferentially refresh neighboring memory cell rows adjacent to a certain memory cell row when the certain memory cell row is accessed for a long time during each access with a low access frequency as well as when the certain memory cell row is accessed frequently. As such, the volatile memory device 850 may effectively reduce a rate of data loss.

The volatile memory device 850 may be embodied with the memory device 200a of FIG. 3. A structure and an operation of the memory device 200a are described above with reference to FIGS. 3 to 13. Therefore, a detail description of the volatile memory device 850 will be omitted.

The nonvolatile memory device 840 may store a boot image for booting the mobile system 800. For example, the nonvolatile memory device 840 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 830 may include at least one input device, such as a keypad, a touch screen, etc., and at least one output device, such as a speaker, a display device, etc. The power supply 860 may supply a power supply voltage to the mobile system 800.

In some embodiments, the mobile system 800 may further include an image processor, and/or a storage device, such as a memory card, a solid state drive (SSD), a hard disk drive (HDD), a CD-ROM, etc.

In some embodiments, the mobile system 800 and/or components of the mobile system 800 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 16:
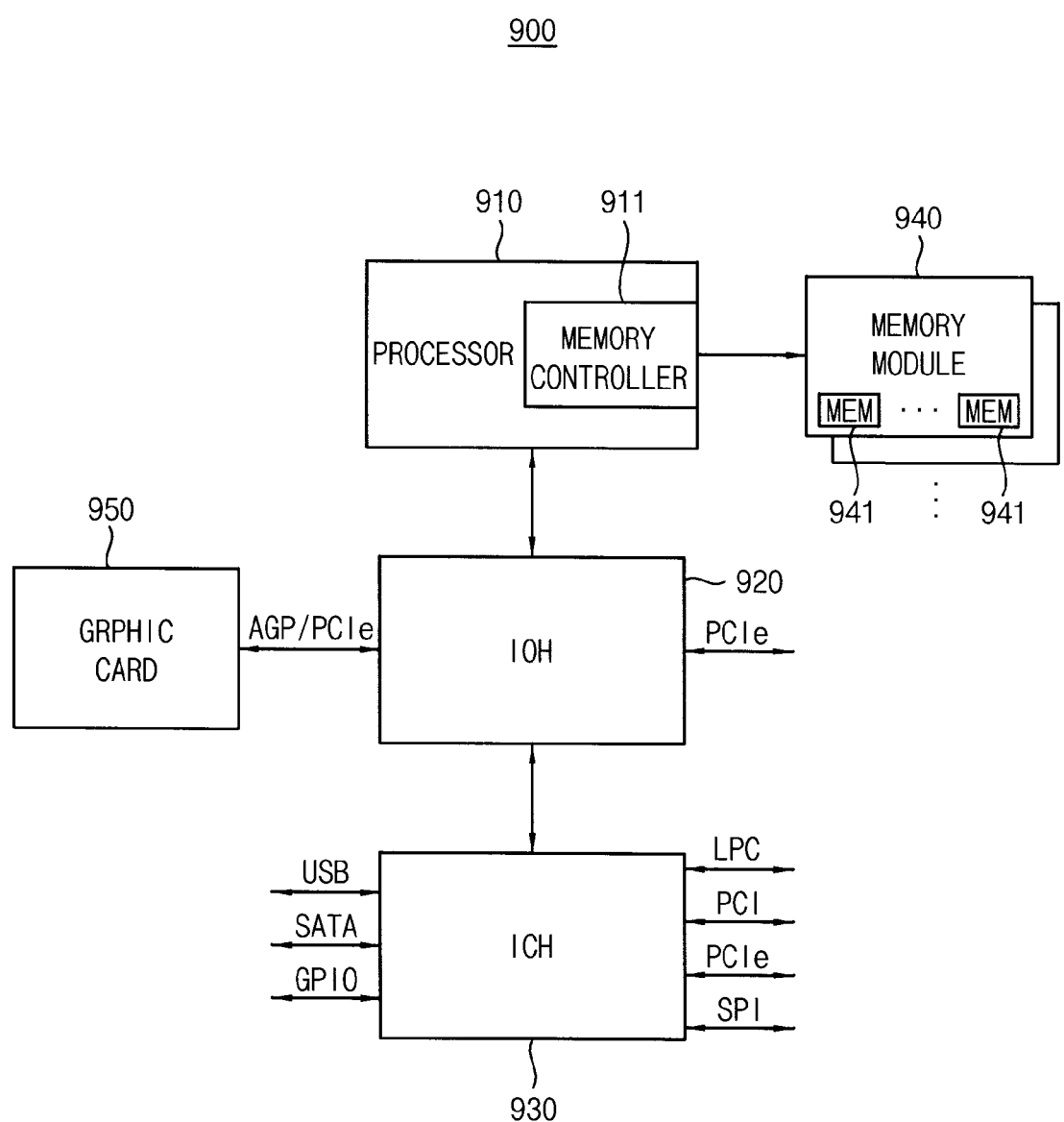
FIG. 16 is a block diagram illustrating a computing system according to exemplary embodiments.

FIG. 16 is a block diagram illustrating a computing system according to exemplary embodiments.

Referring to FIG. 16, a computing system 900 includes a processor 910, an input/output hub (IOH) 920, an input/output controller hub (ICH) 930, at least one memory module 940 and a graphics card 950. In some embodiments, the computing system 900 may be a personal computer (PC), a server computer, a workstation, a laptop computer, a mobile phone, a smart phone, a personal digital assistant (PDA), a portable multimedia player (PMP), a digital camera, a digital television, a set-top box, a music player, a portable game console, a navigation system, etc.

The processor 910 may perform various computing functions, such as executing specific software for performing specific calculations or tasks. For example, the processor 910 may be a microprocessor, a central process unit (CPU), a digital signal processor, or the like. In some embodiments, the processor 910 may include a single core or multiple cores. For example, the processor 910 may be a multi-core processor, such as a dual-core processor, a quad-core processor, a hexa-core processor, etc. Although FIG. 16 illustrates the computing system 900 including one processor 910, in some embodiments, the computing system 900 may include a plurality of processors.

The processor 910 may include a memory controller 911 for controlling operations of the memory module 940. The memory controller 911 included in the processor 910 may be referred to as an integrated memory controller (IMC). A memory interface between the memory controller 911 and the memory module 940 may be implemented with a single channel including a plurality of signal lines, or may be implemented with multiple channels. At least one memory module 940 may be coupled to each of the multiple channels. In some embodiments, the memory controller 911 may be located inside the input/output hub 920. The input/output hub 920 including the memory controller 911 may be referred to as a memory controller hub (MCH).

The memory module 940 may include a plurality of memory devices MEM 941 that store data provided from the memory controller 911. The memory device 941 may generate an intensively accessed row address indicating an intensively accessed memory cell row among a plurality of memory cell rows included in a memory cell array based on a sum of access time for each of the plurality of memory cell rows, and the memory module 940 may preferentially refresh neighboring memory cell rows adjacent to the intensively accessed memory cell row, which is indicated by the intensively accessed row address. Therefore, the memory device 941 may preferentially refresh neighboring memory cell rows adjacent to a certain memory cell row when the certain memory cell row is accessed for a long time during each access with a low access frequency as well as when the certain memory cell row is accessed frequently. As such, the memory device 941 may effectively reduce a rate of data loss.

The memory device 941 may be embodied with the memory device 200a of FIG. 3. A structure and an operation of the memory device 200a are described above with reference to FIGS. 3 to 13. Therefore, a detail description of the memory device 941 will be omitted.

The input/output hub 920 may manage data transfer between the processor 910 and devices, such as the graphics card 950. The input/output hub 920 may be coupled to the processor 910 via various interfaces. For example, the interface between the processor 910 and the input/output hub 920 may be a front side bus (FSB), a system bus, a HyperTransport, a lightning data transport (LDT), a QuickPath interconnect (QPI), a common system interface (CSI), etc. The input/output hub 920 may provide various interfaces with the devices. For example, the input/output hub 920 may provide an accelerated graphics port (AGP) interface, a peripheral component interface-express (PCIe), a communications streaming architecture (CSA) interface, etc. Although FIG. 16 illustrates the computing system 900 including one input/output hub 920, in some embodiments, the computing system 900 may include a plurality of input/output hubs.

The graphics card 950 may be coupled to the input/output hub 920 via the AGP interface or the PCIe. The graphics card 950 may control a display device for displaying an image. The graphics card 950 may include an internal processor for processing image data and an internal memory device. In some embodiments, the input/output hub 920 may include an internal graphics device along with or instead of the graphics card 950 outside the graphics card 950. The graphics device included in the input/output hub 920 may be referred to as integrated graphics. Further, the input/output hub 920 including the internal memory controller and the internal graphics device may be referred to as a graphics and memory controller hub (GMCH).

The input/output controller hub 930 may perform data buffering and an interface arbitration to efficiently operate various system interfaces. The input/output controller hub 930 may be coupled to the input/output hub 920 via an internal bus, such as a direct media interface (DMI), a hub interface, an enterprise Southbridge interface (ESI), the PCIe, etc.

The input/output controller hub 930 may provide various interfaces with peripheral devices. For example, the input/output controller hub 930 may provide a universal serial bus (USB) port, a serial advanced technology attachment (SATA) port, a general purpose input/output (GPIO), a low pin count (LPC) bus, a serial peripheral interface (SPI), PCI, the PCIe, etc.

In some embodiments, the processor 910, the input/output hub 920 and the input/output controller hub 930 may be implemented as separate chipsets or separate integrated circuits. In other embodiments, at least two of the processor 910, the input/output hub 920 and the input/output controller hub 930 may be implemented as a single chipset.

The foregoing is illustrative of the present disclosure and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A memory device, comprising:
    a memory cell array including a plurality of memory cell rows;
    a detection circuit configured to generate a first row address indicating a first memory cell row among the plurality of memory cell rows based on the following parameters:
        (1) a plurality of accumulated access times, each accumulated access time indicating, for a particular memory cell row, an accumulated amount of time that the particular memory cell row has been accessed, and
        (2) a plurality of access number counts, each access number count indicating, for the particular memory cell row, a number of times that the memory cell row has been accessed; and
    a refresh control circuit configured to refresh memory cell rows adjacent to the first memory cell row in response to the generating of the row address,
    wherein the accumulated amount of time that the particular memory cell row has been accessed is a sum of time intervals during which an active signal for the particular memory cell row has been activated.

2. The memory device of claim 1, wherein the detection circuit is configured to receive the active signal.

3. The memory device of claim 1, wherein the detection circuit includes:
    a row address profile circuit configured to store access values, sequentially increase one of the access values in synchronization with a count pulse signal, and generate the first row address based on the access values, wherein each of the access values corresponds to a respective memory cell row among the plurality of memory cell rows.

4. The memory device of claim 1, wherein the detection circuit includes:
    a latch circuit configured to latch a second row address when the active signal is activated, and to output the latched row address;
    a pulse generation circuit configured to generate a count pulse signal while the active signal is activated, the count pulse signal having a first period; and
    a row address profile circuit configured to store access values, to sequentially increase one of the access values, which corresponds to the latched second row address, in synchronization with the count pulse signal, and to generate the first row address based on the access values, each of the access values corresponding to a respective memory cell row among the plurality of memory cell rows.

5. The memory device of claim 4, wherein the first period of the count pulse signal corresponds to a row cycle time of the memory device.

6. The memory device of claim 4, wherein the pulse generation circuit is configured to adjust the first period of the count pulse signal based on a period control signal.

7. The memory device of claim 4, wherein the pulse generation circuit includes:
    a delay circuit configured to be turned on while the active signal is activated, and to generate a delay signal by delaying an input signal for a delay time, the delay time corresponding to a half of the first period, the delay circuit being configured to output the delay signal having a logic low level at an initial stage; and
    an inverter configured to generate the count pulse signal by inverting the delay signal, and to provide the count pulse signal to the delay circuit as the input signal.

8. The memory device of claim 7, wherein the delay circuit is configured to adjust a length of the delay time based on a period control signal.

9. The memory device of claim 4, wherein the pulse generation circuit includes:
    a reference code generation circuit configured to generate a reference code in response to a clock change signal, the reference code being proportional to a frequency of a clock signal;
    a first counting circuit configured to be turned on while the active signal is activated, to generate a time code by performing an up-count operation in synchronization with the clock signal, and to reset the time code in response to a rising edge of a reset signal;
    a comparator configured to output the reset signal having a logic low level when the time code is less than the reference code, and to output the reset signal having a logic high level when the time code is equal to or greater than the reference code; and
    a toggle flip flop configured to generate an output signal and to output the output signal as the count pulse signal, the output signal being configured to toggle in response to the rising edge of the reset signal.

10. The memory device of claim 9, wherein the reference code generation circuit includes:

a delay circuit configured to generate a delay signal by delaying the clock change signal for a delay time, the delay time corresponding to a half of the first period;

an inverter configured to generate an inverted signal by inverting the delay signal;

an AND gate configured to perform an AND operation on the clock change signal and the inverted signal, and to generate a start signal; and a second counting circuit configured to reset a count value and to perform an up-count operation on the count value in synchronization with the clock signal when the start signal is activated to the logic high level, the second counting circuit being configured to stop performing the up-count operation and to output the count value as the reference code when the start signal is deactivated to the logic low level.

11. The memory device of claim 4, wherein the pulse generation circuit bypasses the active signal to output the active signal as the count pulse signal when the pulse generation circuit receives an on-off signal having a first logic level.

12. The memory device of claim 4, wherein, at every predetermined time interval, the row address profile circuit outputs an address, which corresponds to a greatest access value among the access values, as the first row address, and resets the access values.

13. The memory device of claim 4, wherein, when each of the access values exceeds a threshold value, the row address profile circuit outputs an address, which corresponds to one access value among the access values, as the first row address with an interrupt signal, and the row address profiler resets the access values at every predetermined time interval.

14. A memory system, comprising:
a memory device including:
 a plurality of memory cell rows;
 a control logic configured to control operations of the memory device;
 a row address multiplexer configured to perform a refresh operation;
 a column address latch configured to store a column address;
 a row decoder;
 a column decoder;
a detection circuit configured to generate a first row address indicating a first memory cell row among the plurality of memory cell rows based on the following parameters:
 (1) a plurality of accumulated access times, each accumulated access time indicating, for a particular memory cell row, an accumulated amount of time that the particular memory cell row has been accessed, and
 (2) a plurality of access number counts, each access number count indicating, for the particular memory cell row, a number of times that the memory cell row has been accessed;
a refresh control circuit configured to refresh memory cell rows adjacent to the first memory cell row in response to the generating of the row address; and
a memory controller configured to perform a read operation and a write operation on the memory device, and to provide a command and an address to the memory device, wherein the accumulated amount of time that the particular memory cell row has been accessed is a sum of time intervals during which an active signal for the particular memory cell row has been activated.

15. The memory system of claim 14, wherein the detection circuit receives the active signal from the memory controller.

16. The memory system of claim 14, wherein the detection circuit includes a pulse generation circuit configured to generate a count pulse signal while the active signal is activated, the count pulse signal having a first period, and configured to stop generating the count pulse signal while the active signal is deactivated.

17. The memory system of claim 16, wherein the first period of the count pulse signal corresponds to a row cycle time of the memory device.

18. The memory system of claim 14, wherein the refresh control circuit is configured to generate a refresh row address that sequentially increases, and to refresh a memory cell row corresponding to the refresh row address.

19. A mobile device comprising:
an application processor;
a user interface;
a power supply configured to supply a power supply voltage to the mobile device;
a nonvolatile memory device; and
a volatile memory device including a plurality of memory cell rows,
wherein the volatile memory device is configured to generate a first row address indicating a first memory cell row among the plurality of memory cell rows based on the following parameters:
 (1) a plurality of accumulated access times, each accumulated access time indicating, for a particular memory cell row, an accumulated amount of time that the particular memory cell row has been accessed, and
 (2) a plurality of access number counts, each access number count indicating, for the particular memory cell row, a number of times that the memory cell row has been accessed,
wherein the volatile memory device is configured to refresh memory cell rows adjacent to the first memory cell row in response to the generating of the row address, and
wherein the accumulated amount of time that the particular memory cell row has been accessed is a sum of time intervals during which an active signal for the particular memory cell row has been activated.

20. The mobile device of claim 19, wherein the volatile memory device includes a refresh control circuit configured to generate a refresh row address that sequentially increases, and configured to refresh a memory cell row corresponding to the refresh row address, and
wherein, when the refresh control circuit receives the first row address at every time interval of a set of predetermined time intervals, the refresh control unit refreshes a memory cell row corresponding to a first refresh address which is less than the first row address by one, and a memory cell row corresponding to a second refresh address which is greater than the first row address by one, and then refreshes the memory cell row corresponding to the refresh row address.

* * * * *